US007700963B2

(12) United States Patent
Takakura et al.

(10) Patent No.: US 7,700,963 B2
(45) Date of Patent: Apr. 20, 2010

(54) NITRIDE SEMICONDUCTOR LIGHT-EMITTING DEVICE

(75) Inventors: Teruyoshi Takakura, Tenri (JP);
Shigetoshi Ito, Shijonawate (JP);
Takeshi Kamikawa, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/216,533

(22) Filed: Jul. 7, 2008

(65) Prior Publication Data

US 2008/0283866 A1 Nov. 20, 2008

Related U.S. Application Data

(62) Division of application No. 11/296,532, filed on Dec. 8, 2005, now Pat. No. 7,410,819.

(30) Foreign Application Priority Data

Dec. 8, 2004 (JP) ............................. 2004-355426
Nov. 14, 2005 (JP) ............................. 2005-329064

(51) Int. Cl.
*H01L 33/00* (2010.01)

(52) U.S. Cl. .................. 257/95; 257/E33.025

(58) Field of Classification Search ................... 257/95, 257/E33.025
See application file for complete search history.

(56) References Cited

U.S. PATENT DOCUMENTS 6,468,347 B1 * 10/2002 Motoki et al. ................. 117/89
6,924,500 B2 * 8/2005 Okuyama et al. ............. 257/13
7,109,049 B2 9/2006 Takakura et al.
7,157,297 B2 1/2007 Kamikawa et al.
2002/0038870 A1 * 4/2002 Kunisato et al. .............. 257/85
2002/0115267 A1 8/2002 Tomiya et al.
2004/0041156 A1 3/2004 Tsuda et al.
2005/0025204 A1 2/2005 Kamikawa et al.
2005/0141577 A1 6/2005 Ueta et al.
2005/0186694 A1 8/2005 Takakura et al.
2006/0094244 A1 5/2006 Yamada et al.

FOREIGN PATENT DOCUMENTS

JP 2002-246698 (A) 8/2002
JP 2005-236109 (A) 9/2005

* cited by examiner

*Primary Examiner*—W. David Coleman
(74) *Attorney, Agent, or Firm*—Harness, Dickey & Pierce, P.L.C.

(57) ABSTRACT

In a method for producing a nitride semiconductor light-emitting device according to the present invention, first, a nitride semiconductor substrate having groove portions formed is prepared. An underlying layer comprising nitride semiconductor is formed on the nitride semiconductor substrate including the side walls of the groove portions, in such a manner that the underlying layer has a crystal surface in each of the groove portions and the crystal surface is tilted at an angle of from 53.5° to 63.4° with respect to the surface of the substrate. Over the underlying layer, a light-emitting-device structure composed of a lower cladding layer containing Al, an active layer, and an upper cladding layer containing Al is formed. According to the present invention, thickness nonuniformity and lack of surface flatness, which occur when accumulating a layer with light-emitting-device structure of nitride semiconductor over the nitride semiconductor substrate, are alleviated while inhibiting occurrence of cracking.

4 Claims, 7 Drawing Sheets

{0001} surface (B)

Coordinate system of a hexagonal crystal

Prior Art

NITRIDE SEMICONDUCTOR LIGHT-EMITTING DEVICE

CROSS-REFERENCE TO RELATED APPLICATIONS

This application claims priority under 35 U.S.C. §§ 120, 121 to and is a divisional application of U.S. patent application entitled, NITRIDE SEMICONDUCTOR LIGHT-EMITTING DEVICE AND METHOD FOR PRODUCING SAME, filed Dec. 8, 2005 now U.S. Pat. No. 7,410,819, currently having Ser. No. 11/296,532, which claims priority to Japanese Patent Application No. 2004-355426, filed with the Japanese Patent Office on Dec. 8, 2004, and Japanese Patent Application No. 2005-329064, filed with the Japanese Patent Office on Nov. 14, 2005, priority is hereby claimed to all of the above mentioned prior filed applications and the contents of which are all hereby incorporated herein by reference in their entirety.

BACKGROUND OF THE INVENTION

The present invention relates to a method for producing a nitride semiconductor light-emitting device, and more particularly to a method for producing a nitride semiconductor light-emitting device improved to prevent cracking and obtain nitride semiconductors and nitride semiconductor laser devices at a high yield rate. The present invention also relates to a nitride semiconductor light-emitting device obtained by such a method.

By using nitride semiconductor crystals represented by GaN, AlN, InN, and mixed crystals thereof, semiconductor laser devices that oscillate in the ultraviolet-visible region are being produced. As the substrate, a GaN substrate is often used and being studied with vigor in associated research institutions. Currently, the yield rate of semiconductor laser devices (e.g., the rate of good products obtained from one wafer) is significantly low, and improvement is highly necessary for cost reduction and the like. One of the causes that have kept the yield rate low is the occurrence of cracking.

Figure 6:
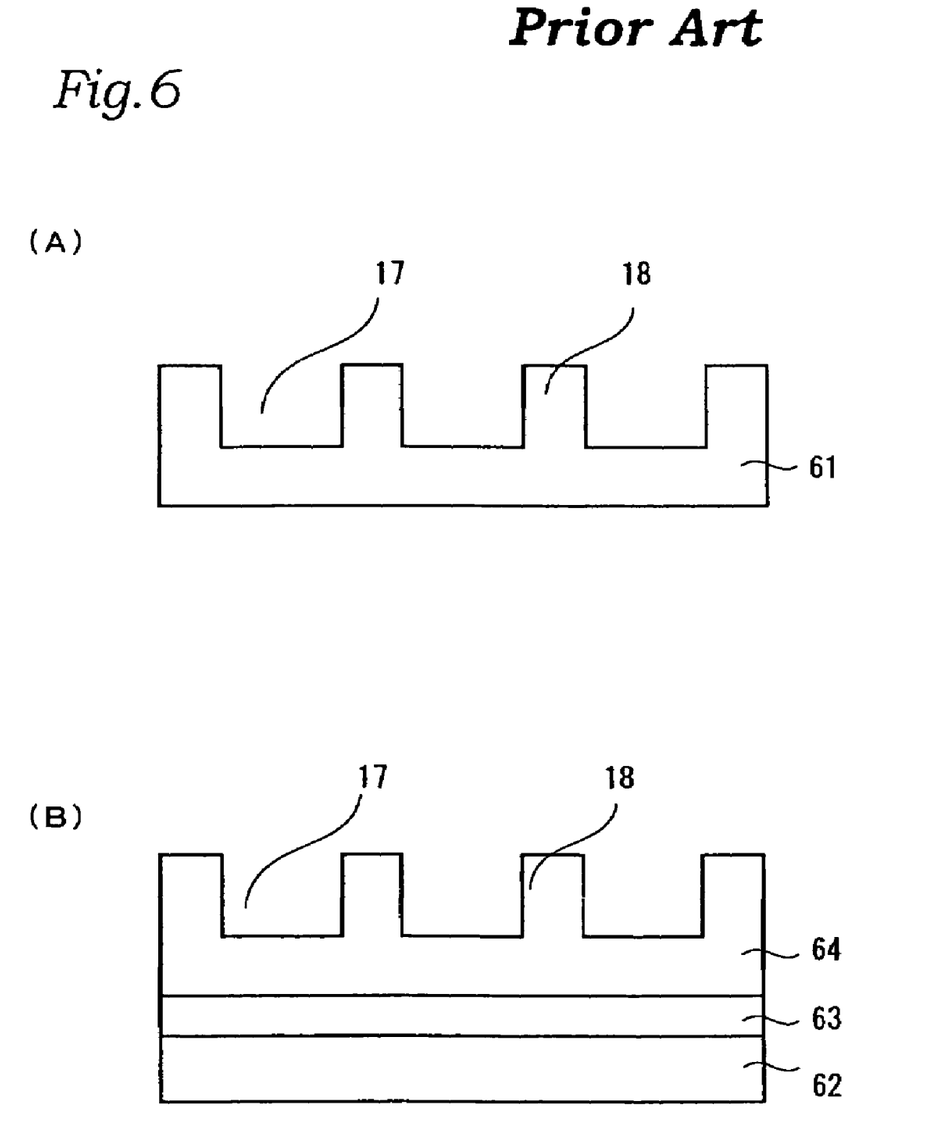
FIG. 6 is a cross sectional view of a conventional processed substrate.

As a technique to reduce occurrence of cracking, a method of using a processed substrate is proposed as shown in FIG. 6 (see, for example, Japanese Patent Application Publication No. 2002-246698). Referring to FIG. 6(A), processed substrate 61 (nitride semiconductor substrate) includes grooves 17 that are concave portions each processed in a stripe shape on the substrate surface. Over hills 18, which are convex portions each processed in a stripe shape, a light-emitting device made of nitride semiconductor is formed. It is known that by using such processed substrate 61 concaves are included in the surfaces of the semiconductor films that have been grown, thereby inhibiting occurrence of cracking in the light-emitting device.

It is also known that cracking is reduced by using a processed substrate shown in FIG. 6(B). This processed substrate has different kind substrate 62 (sapphire substrate, SiC substrate, Si substrate, GaAs substrate, or the like) and nitride semiconductor layer 64 formed over different kind substrate 62 via buffer layer 63 (nitride semiconductor layer (of low temperature or high temperature)). On the surface of nitride semiconductor layer 64, grooves 17 are formed each in a stripe shape. Over hills 18, which are convex portions each processed in a stripe shape, a light-emitting device made of nitride semiconductor is formed.

However, when the above-described processed substrate was used and nitride compound semiconductors were grown over the substrate by the MOCVD (Metal Organic Vapor Deposition) method or the like to prepare a semiconductor laser device, occurrence of cracking was prevented, but no great improvement in the yield rate was obtained.

Figure 7:
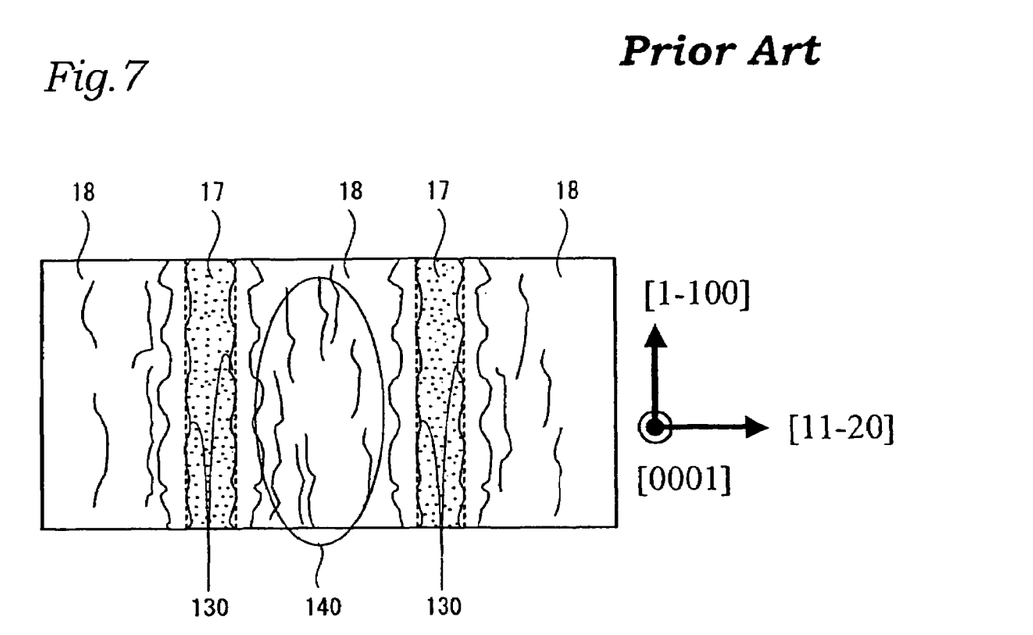
FIG. 7 is a view for showing a problem associated with use of the conventional processed substrate.

The prevent inventors carried out an extensive study to analyze the cause of why the yield rate did not improve greatly. As a result, as shown in FIG. 7, it has been found that nitride semiconductor layers (those in the areas 130 shown in FIG. 7) accumulated so as to cover from the side surfaces of the groove portions (the portions where grooves portions 17 and hill portions 18 were in contact) to hill portions 18 have undulating-shaped surface morphologies 140 and are grown much thicker than at the center portions of hill portions 18. (This growth will be hereinafter referred to as abnormal growth.) In addition, the sizes and thicknesses of abnormal growth portions 130, caused by abnormal growth, were different between adjacent groove portions 17, and along the stripe of the groove portion 17 even if it was the same groove portion 17. It has been found that if abnormal growth portion 130 is not formed uniformly in each groove portion 17 as described above, the formation of undulating-shaped surface morphology 140 is promoted in the vicinity of the edges of groove portion 17, and that the promoted surface morphology 140 undermines the thickness uniformity and flatness of the nitride semiconductor layers in the vicinity of the center of hill portion 18. It is considered that occurrence of such a phenomenon is because when grooves 17 are formed on the nitride semiconductor substrate by dry etching or wet etching, the edge portions of the sides of groove portions 17 cannot be made uniform and take various shapes.

Thus, if concaves (grooves) remain on a nitride compound semiconductor, the concaves cause deterioration of the flatness of the film. It is considered that the deteriorated flatness in turn causes variation of thickness of each layer of the device and chip-to-chip fluctuation of characteristics, resulting in a deteriorated yield rate. In other words, in order to improve the yield rate, it is necessary to improve film flatness as well as reducing occurrence of cracking.

SUMMARY OF THE INVENTION

It is an object of the present invention to provide a method for producing a nitride semiconductor light-emitting device improved to prevent occurrence of cracking and produce a nitride semiconductor compound film that has high flatness.

It is another object of the present invention to provide a method for producing a nitride semiconductor light-emitting device improved to obtain a semiconductor laser device at a high yield rate.

It is another object of the present invention to provide a method for producing a nitride semiconductor light-emitting device improved to obtain a highly reliable semiconductor laser device.

It is another object of the present invention to provide a nitride semiconductor light-emitting device obtained by the above method.

In a method for producing a nitride semiconductor light-emitting device according to the present invention, first, a nitride semiconductor substrate having stripe groove portions is prepared. An underlying layer comprising nitride semiconductor is formed on the nitride semiconductor substrate including the side walls of the groove portions, in such a manner that the underlying layer has a crystal surface in each of the groove portions and the crystal surface is tilted at an angle of from 53.5° to 63.4° with respect to the surface of the substrate. Over the underlying layer, a lower cladding layer containing Al, an active layer, and an upper cladding layer containing Al are sequentially formed.

With this invention, since a crystal surface that is tilted at an angle of from 53.5° to 63.4° with respect to the substrate surface is formed in each of the groove portions, and a layer of light-emitting-device structure made of nitride semiconductor is formed over the substrate while maintaining the crystal surface, the uniformity and flatness of the layer of light-emitting-device structure accumulated over the hill portion between the groove portions are improved. By forming a laser waveguiding structure over the layer of light-emitting-device structure formed in the region of the hill portion, variation of characteristics between nitride semiconductor light-emitting devices (chips) is reduced, resulting in an improved yield rate of nitride semiconductor light-emitting devices.

In a preferred embodiment of the present invention, the composition ratio of Al of the underlying layer is lower than the composition ratio of Al of the lower cladding layer. More preferably, the composition ratio of Al in the underlying layer is 5% or lower.

This is because if such an underlying layer is formed that has the same Al composition ratio as or higher Al composition ratio than that of the lower cladding layer, the shapes of the groove portions are maintained (that is, no crystal surface is formed), and unless the underlying layer is grown considerably thick, the crystal surface is not formed in the vicinity of the side surface of each groove portion. Since such a tendency becomes notable as the composition ratio of Al contained in the underlying layer becomes higher, the composition ratio of Al contained in the underlying layer is preferably 5% or lower. Use of such an underlying layer that does not contain Al and is made of GaN is particularly preferable in that the accumulation thickness of the underlying layer is thin and the crystal surface is formed with ease.

The present invention is characterized in that the crystal surface comprises a {11-22} surface.

Since the {11-22} surface is stable and a rather flat surface, the uniformity of thickness of the nitride semiconductor layers in the vicinity of the center of the hill portion is realized. Further, formation of the above-described undulating-shaped surface morphology that undermines flatness is prevented satisfactorily.

After the crystal surface is formed by accumulation of the underlying layer, the crystal surface is maintained through subsequent accumulation of the underlying layer. However, as the thickness of the underlying layer increases, the grooves are covered with nitride semiconductor (underlying layer) and the area of the crystal surface formed in the vicinity of the side surface of each groove gradually decreases, and consequently, the grooves are completely filled up and the crystal surface disappears. In view of this, the thickness of the underlying layer needs to be limited such that the grooves are not completely filled up (that is, the crystal surface does not disappear). Preferably, the thickness of the underlying layer is from 0.01 µm to 2 µm.

The depth of each of the groove portions may be from 0.5 µm to 20 µm, and more preferably from 0.5 µm to 8 µm. If the depth of each of the grooves is less than 0.5 µm, although the crystal surface appears after commencement of growth of the underlying layer, the grooves are filled up in the course of growth and the crystal surface cannot be maintained, which is not preferable. As the groove becomes deeper, surface flatness deteriorates, and therefore, the groove depth Z is preferably 8 µm or less. On the other hand, if the depth Z of each of the groove portions exceeds 20 µm, cracking of the wafer occurs in the production process of the nitride semiconductor laser device, which is not preferable. By selecting the depth of the groove portions in this manner, the groove portions are prevented from being filled up by nitride semiconductor, and consequently, the crystal surface is prevented from disappearing.

The width of each of the grooves is preferably from 5 µm to 100 µm. This is because if the width of each of the grooves is less than 5 µm, the grooves are filled up by nitride semiconductor (underlying layer) and the crystal surface disappears, and thus improvement of flatness and uniformity of the nitride semiconductor layers cannot be expected. If the width of the grooves exceeds 100 µm, the number of nitride semiconductor light-emitting devices (chips) obtained from one wafer is reduced, which is not preferable.

A nitride semiconductor light-emitting device according to another aspect of the present invention comprises a nitride semiconductor substrate. On the nitride semiconductor substrate, an underlying layer made of nitride semiconductor is provided. On the underlying layer, a lower cladding layer containing Al, an active layer, and an upper cladding layer containing Al are sequentially provided.

By providing an underlying layer made of nitride semiconductor on the nitride semiconductor substrate, the uniformity and flatness of the layer of light-emitting-device structure accumulated over the hill portion between the groove portions are improved, as described above. By forming a laser waveguiding structure over the layer of light-emitting-device structure formed in the region of the hill portion, variation of characteristics between nitride semiconductor light-emitting devices (chips) is reduced, resulting in an improved yield rate of nitride semiconductor light-emitting devices.

The composition ratio of Al of the underlying layer is preferably lower than the composition ratio of Al of the lower cladding layer. More preferably, the composition ratio of Al of the underlying layer is 5% or lower. More preferably, the underlying layer comprises GaN.

The thickness of the underlying layer is preferably from 0.01 µm to 2 µm.

By using the present invention, nitride semiconductor grown layers with good surface flatness and inhibited cracking are formed over the nitride semiconductor substrate. This enables it to obtain highly reliable nitride semiconductor light-emitting devices at a high yield rate.

BRIEF DESCRIPTION OF THE DRAWINGS

In the figures, reference numeral 10 denotes a nitride semiconductor substrate, 11 denotes a layer of light-emitting-device structure made of nitride semiconductor, 12 denotes a ridge stripe portion, 13 denotes an insulation film, 14 denotes a p-electrode, 15 denotes an n-electrode, 16 denotes a crystal surface, 17 denotes a groove portion (groove), 18 denotes a hill portion (hill), 21 denotes an underlying layer made of nitride semiconductor, 22 denotes an n-type $Al_{0.062}Ga_{0.938}N$ first cladding layer, 23 denotes an n-type $Al_{0.1}Ga_{0.9}N$ second cladding layer, 24 denotes an n-type $Al_{0.062}Ga_{0.938}N$ third cladding layer, 25 denotes an n-type GaN light guiding layer, 26 denotes an active layer of multi-quantum well structure, 27 denotes a p-type $Al_{0.3}Ga_{0.7}N$ carrier blocking layer, 28 denotes a p-type GaN light guiding layer, 29 denotes a p-type $Al_{0.1}Ga_{0.9}N$ cladding layer, 30 denotes a p-type GaN contact layer, 41 denotes a dividing line, 100 denotes the normal direction of the nitride semiconductor substrate, 101 denotes the normal direction of the underlying layer, 110 denotes the normal direction of the crystal surface, 120 denotes the angle between the nitride semiconductor substrate or the underlying layer and the crystal surface, 130 denotes a portion of abnormal growth, and 140 denotes undulating-shaped surface morphology.

DETAILED DESCRIPTION OF PREFERRED EMBODIMENTS

Preparation of nitride semiconductor grown layers with good surface flatness and inhibited cracking over a nitride semiconductor substrate, which is an object of the present invention, has been realized by preparing a nitride semiconductor substrate having stripe groove portions, and by forming an underlying layer having nitride semiconductor on the nitride semiconductor substrate including the side walls of the groove portions, in such a manner that the underlying layer has a crystal surface in each of the groove portions and the crystal surface is tilted at an angle of from 53.5° to 63.4° with respect to the surface of the substrate.

First, the meanings of terms used in this specification will be clarified in advance.

The term "nitride semiconductor substrate" can be any substrate that is made of nitride semiconductor, examples including a $Al_aGa_bIn_cN$ ($0 \leq a \leq 1$, $0 \leq b \leq 1$, $0 \leq c \leq 1$, $a+b+c=1$) substrate. It is also possible that approximately 10% or less of the nitrogen element (of hexagonal crystal system) in the $Al_aGa_bIn_cN$ ($0 \leq a \leq 1$, $0 \leq b \leq 1$, $0 \leq c \leq 1$, $a+b+c=1$) substrate is replaced with any one of the elements As, P, and Sb.

Figure 1:
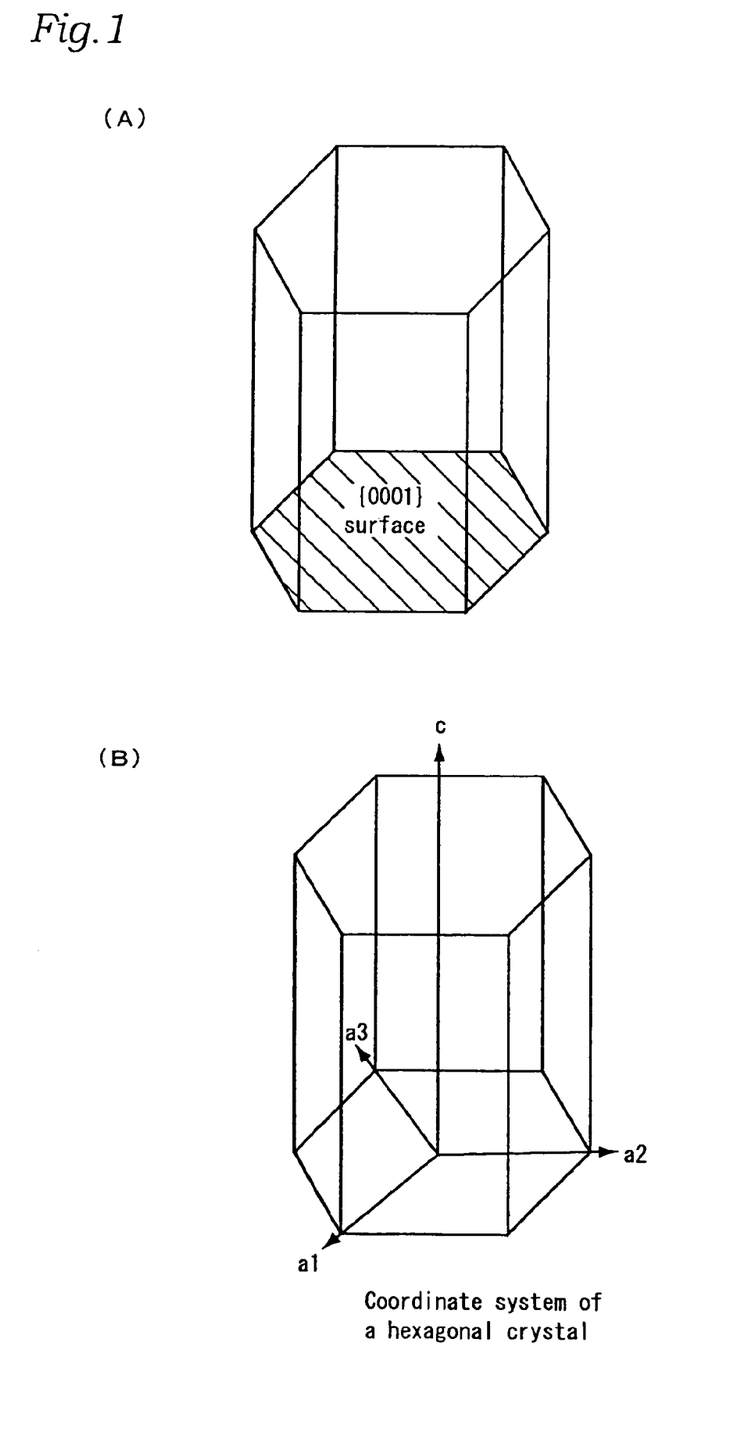
FIG. 1(A) is a view showing the C surface of a hexagonal crystal.
FIG. 1(B) is a view showing the coordinate system of a hexagonal crystal.

It is also possible that the nitride semiconductor substrate is doped with Si, O, Cl, S, C, Ge, Zn, Cd, Mg, or Be. For n-type nitride semiconductor, Si, O, and Cl are particularly preferable among the above doping materials. Referring to FIG. 1(A), the main surface orientation of the nitride semiconductor substrate is most preferably the C surface {0001}. If the substrate main surface has an off angle (tilt of the substrate surface from the C surface) of 2° or less with respect to the C surface, the surface morphology is satisfactory. Further, if the off angle is in a parallel direction of the groove to be prepared, the shape of the side surfaces of the groove is stabilized, resulting in more satisfactory surface morphology. FIG. 1(B) shows the coordinate system of a hexagonal crystal. Examples of the nitride semiconductor substrate preferably used in the present invention include a GaN substrate, an AlN substrate, and an AlGaN substrate.

The term "groove portion" or "groove" as used in this specification denotes a stripe concave portion on the upper surface (growth surface) of the nitride semiconductor substrate. The term "hill portion" or "hill" denotes a stripe convex portion between a groove and a groove. It should be noted that the cross sectional view of each of the groove and hill is not necessarily rectangular, and for example, a forward tapered shape or an inverse tapered shape can be used.

The term "side surface of the groove portion" as used in this specification denotes the side surface shared by the groove and hill as a result of the digging and forming of the groove.

The term "active layer" as used in this specification denotes a general term for a layer composed of a well layer or well layers and barrier layers. For example, an active layer of single quantum well structure is composed of one well layer or barrier layer/well layer/barrier layer. An active layer of multi-quantum well structure is composed of a plurality of well layers and a plurality of barrier layers.

Although it is common practice in crystallography to draw a line above the absolute value to indicate the case where the index of the surface or orientation of the crystal is negative, such a way of indication is impossible in this specification. Therefore, the negativity of the index will be indicated by the negative sign "−" placed in front of the absolute value, e.g., the {11-22} surface and the <1-100> direction.

An embodiment of the present invention will be described below by reference to the drawings. First, preferred conditions for forming the underlying layer, which are features of the present invention, will be described, followed by a description of a nitride light-emitting device formed over the substrate including the underlying layer.

1) Formation of Underlying Layer

Figure 2:
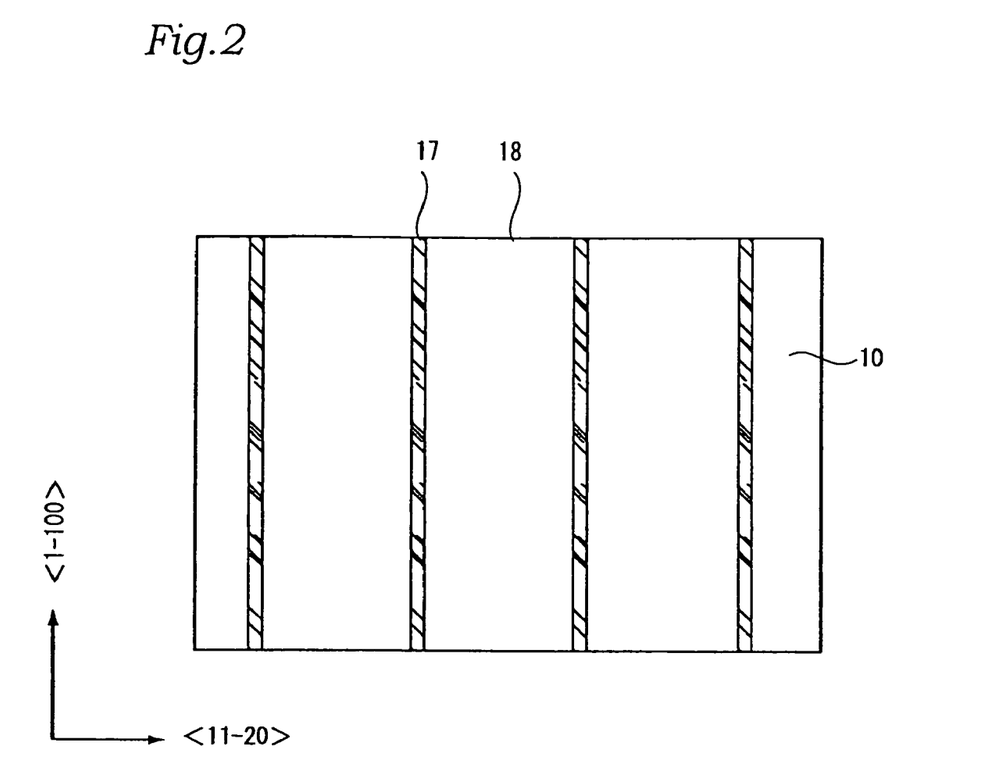
FIG. 2 is a view showing the upper surface of the nitride semiconductor substrate before formation of the underlying layer.
Figure 3:
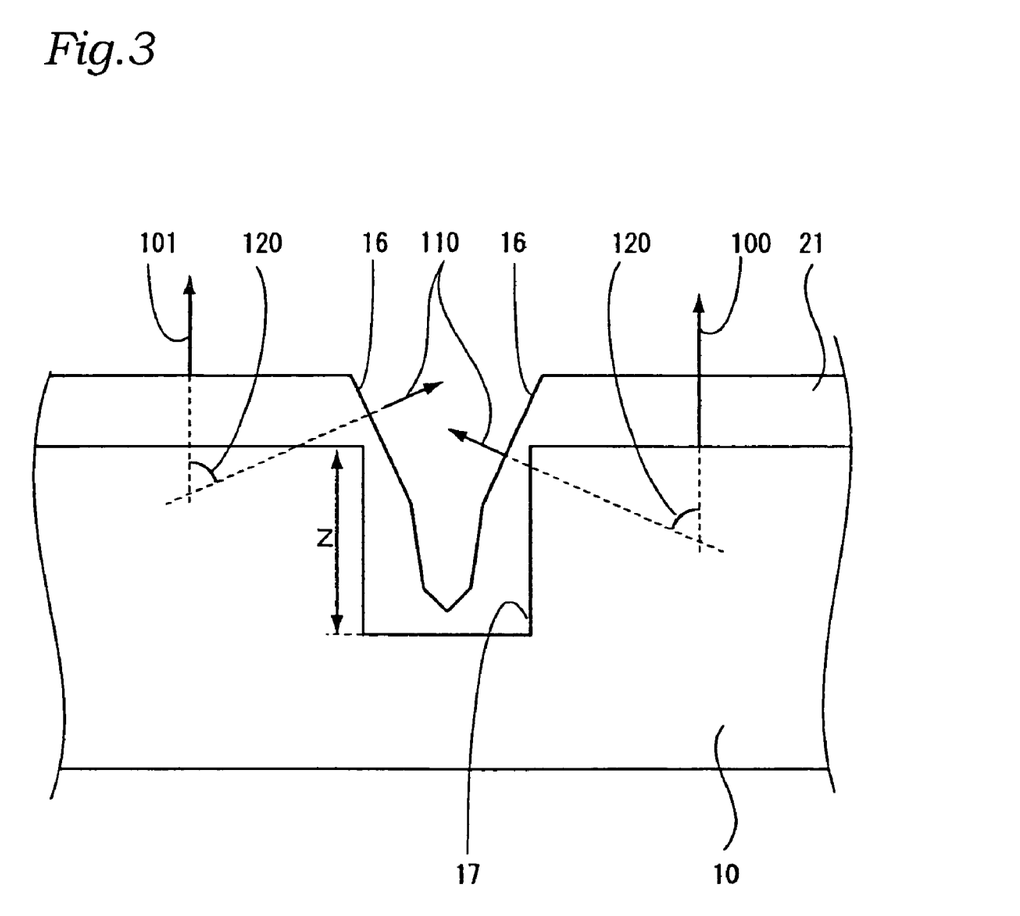
FIG. 3 is a cross sectional view of the nitride semiconductor substrate on which the underlying layer is formed.

FIG. 2 is a view showing the upper surface of the nitride semiconductor substrate before formation of the underlying layer. The surface orientations are also shown. Referring to FIG. 2, stripe groove portions 17 are formed on the surface of nitride semiconductor substrate 10 (e.g., an n-type GaN substrate). Referring to FIG. 3 (a cross sectional view of the nitride semiconductor substrate in the vicinity of a groove portion), underlying layer 21 made of nitride semiconductor is accumulated on nitride semiconductor substrate 10 including the side walls of groove portion 17. By accumulating underlying layer 21, in the vicinity of the side surfaces of groove portion 17, crystal surfaces 16 each tilted at an angle of from 53.5° to 63.5° with respect to the surface of nitride semiconductor substrate 10 are formed.

By using FIG. 3, the angle of crystal surface 16 according to the present invention will be defined. Crystal surface 16 that is tilted at an angle of from 53.5 to 63.5° with respect to the surface of nitride semiconductor substrate 10 means such a crystal surface that angle 120 between normal direction 100 of nitride semiconductor substrate 10 (or normal direction 101 of layer 21 of light-emitting-device structure made of nitride semiconductor in the vicinity of the hill portion) and normal direction 100 of the crystal surface is 53.5° or greater and 63.5° or less. This crystal surface 16 is so stable that once it is formed in the vicinity of the side surface of groove portion 17, transition to another crystal surface is hard to occur. This means that the shapes of the vicinities of the side surfaces of groove portions 17 (i.e., the shapes of the edges of the groove portions) become approximately uniform over the entire regions of groove portions 17 formed on nitride semiconductor substrate 10 (i.e., the edges of groove portions 17 are occupied by crystal surfaces 16).

If the shapes of the vicinities of the side surfaces of groove portions 17 become uniform, undulating-shaped surface morphology is inhibited as described later, and uniformity and flatness of the thickness of the nitride semiconductor layers in the vicinity of the center of the hill portion (layer 11 of light-emitting-device structure made of nitride semiconductor shown in FIG. 4, described later) are considered to be realized.

The composition ratio of Al in underlying layer 21, which is made of nitride semiconductor and formed on nitride semiconductor substrate 10 on which stripe groove portions 17 are formed, is preferably lower than the composition ratio of Al in the lower cladding layer. Since the lower cladding layer confines light from the light-emitting layer, the Al composition ratio needs to be generally made high. Here the lower cladding layer or upper cladding layer is, specifically, AlGaN and InAlGaN, and the Al composition ratio is preferably from 0.04 to 0.15. This is because if such an underlying layer is formed that has the same Al composition ratio as or higher Al composition ratio than that of the lower cladding layer, then underlying layer 21 is formed such that the shape of groove portion 17 (formed on nitride semiconductor substrate 10 by the dry etching method or wet etching method) is maintained (i.e., no crystal surface is formed), or unless underlying 21 is grown considerably thick, the above-described crystal surface 16 is not formed in the vicinity of the side surface of groove portion 17. Since such a tendency becomes notable as the composition ratio of Al contained in the underlying layer becomes higher, the composition ratio of Al contained in the underlying layer is preferably 5% or lower. Use of such an underlying layer that does not contain Al and is made of GaN is particularly preferable in that the accumulation thickness of the underlying layer is thin and the crystal surface is formed with ease.

Crystal surface 16 preferably is a surface containing the {11-22} surface. Since the {11-22} surface is stable and a rather flat surface, the uniformity of thickness of the nitride semiconductor layers in the vicinity of the center of the hill portion is realized, and further, formation of the above-described undulating-shaped surface morphology 140 (see FIG. 7) that undermines flatness is prevented satisfactorily.

After the above-described crystal surface 16 is formed by accumulation of underlying layer 21, crystal surface 16 is maintained through subsequent accumulation of the underlying layer. However, as the thickness of underlying layer 21 increases, the inside in the groove portion is covered with nitride semiconductor (underlying layer) and the area of the crystal surface formed in the vicinity of the side surface of groove portion 17 gradually decreases, and consequently, groove portion 17 is completely filled up and the crystal surface disappears. In view of this, the thickness of underlying layer 21 needs to be limited such that groove portion 17 is not completely filled up (that is, the crystal surface does not disappear). Preferably, the thickness of underlying layer 21 is from 0.01 μm to 2 μm.

The depth Z of groove portion 17 may be from 0.5 μm to 20 μm, and more preferably from 0.5 μm to 8 μm. If the depth of groove portion 17 is less than 0.5 μm, although crystal surface 16 appears after commencement of growth of underlying layer 21, groove portion 17 is filled up in the course of growth and crystal surface 16 cannot be maintained, which is not preferable. As the groove becomes deeper, surface flatness deteriorates, and therefore, the groove depth Z is preferably 8 μm or less. On the other hand, if the depth Z of groove portion 17 exceeds 20 μm, cracking of the wafer occurs in the production process of the nitride semiconductor laser device, which is not preferable. By selecting the depth of groove portion 17 in this manner, groove portion 17 is prevented from being filled up by nitride semiconductor (the portions represented by reference numeral 21 and 11 in FIG. 4, described later), and consequently, the crystal surface is prevented from disappearing.

The width of groove portion 17 is preferably from 5 μm to 100 μm. This is because if the width of groove portion 17 is less than 5 μm, groove portion 17 is filled up by nitride semiconductor (underlying layer) and the crystal surface disappears, and thus improvement of flatness and uniformity of the nitride semiconductor layers cannot be expected. If the width of groove portion 17 exceeds 100 μm, the number of nitride semiconductor light-emitting devices (chips) obtained from one wafer is reduced, which is not preferable.

2) Formation of Nitride Light-emitting Device

As an example of the nitride light-emitting device, a nitride semiconductor laser device will be described. FIG. 4 is a schematic cross sectional view of a part of a bar provided with a nitride semiconductor laser device of this embodiment. In this embodiment, as nitride semiconductor substrate 10, an n-type GaN substrate with the C surface being the main surface is used. On the n-type GaN substrate (nitride semiconductor substrate 10), groove portions 17 and hill portion 18 are formed in the direction parallel to the <1-100> direction. The cross sectional shapes of the groove portions and hill portion are rectangular. FIG. 5 is a schematic cross sectional view of the vicinity of the hill portion shown in FIG. 4, and the structure of layer 11 of light-emitting-device structure made of nitride semiconductor is shown. Layer 11 of light-emitting-device structure made of nitride semiconductor shown in FIG. 4 corresponds to the nitride semiconductor layers represented by reference numeral 22 to 30 shown in FIG. 5.

Next, a method for producing the nitride semiconductor laser device of this embodiment will be described. First, referring to FIGS. 3 and 4, n-type GaN substrate 10 having stripe groove portions 17 is prepared. To describe specifically, on the upper surface of n-type GaN substrate 10, $SiO_2$, $SiN_x$, or the like is deposited (not shown). It should be noted that although $SiO_2$ is used in this embodiment, this is not to be restrictive and another dielectric film or the like can be used. Next, on the $SiO_2$ film, a resist material is applied, and by using a general lithography technique, a stripe-shaped resist-mask pattern is formed in the <1-100> direction (not shown). Next, by using the RIE (Reactive Ion Etching) technique or the like, etching is carried out over $SiO_2$ and the upper surface of n-type GaN substrate 10, thereby forming groove portions 17. Then, by using an etchant such as HF (hydrofluoric acid), $SiO_2$ is removed, thereby preparing n-type GaN substrate 10 on which stripe groove portions 17 are formed in the direction parallel to the <1-100> direction. In this embodiment, the width of each of groove portions 17 was 5 μm, the width of hill portion 18 was 395 μm, and the depth Z of groove portions 17 was 5 μm.

It should be noted that although in this embodiment, the RIE technique was used in forming groove portions 17 by subjecting the upper surface of n-type GaN substrate 10 to etching, this method is not to be restrictive and the wet etching technique or the like can be used. In addition, the cross sectional shape of each of groove portions 17 (or hill portion 18) can be rectangular, or a forward tapered shape such that the width of the opening portion of each of groove portions 17 is wider than the width of the bottom surface portion, or inversely, an inverse tapered shape such that the opening portion of each of groove portions 17 is narrower than the width of the bottom surface portion.

Next, by carrying out treatment in accordance with the conditions described in (1) above, underlying layer 21 (e.g., an n-type GaN underlying layer) is formed on substrate 10. Over substrate 10 on which underlying layer 21 is formed, a nitride semiconductor laser device is prepared by using the MOCVD method or the like.

As shown in FIG. 5, the nitride semiconductor laser device includes n-type GaN 10, underlying layer 21 made of nitride semiconductor of 0.2 μm thick, n-type $Al_{0.062}Ga_{0.938}N$ first cladding layer 22 (1.5 μm), n-type $Al_{0.1}Ga_{0.9}N$ second cladding layer 23 (0.2 μm), n-type $Al_{0.062}Ga_{0.938}N$ third cladding layer 24 (0.1 μm), n-type GaN guiding layer 25 (0.1 μm), active layer 26 of multi-quantum well structure composed of four 8 nm-thick $In_{0.1}Ga_{0.99}N$ barrier layers and three 4 nm-thick $In_{0.1}Ga_{0.9}N$ well layers, p-type $Al_{0.3}Ga_{0.7}N$ carrier blocking layer 27 of 20 nm thick, p-type GaN light guiding layer 28 of 0.1 μm thick, p-type $Al_{0.1}Ga_{0.9}N$ cladding layer 29 of 0.5 μm thick, and p-type GaN contact layer 30 of 0.1 μm thick.

Here the lower cladding layer of this embodiment is an n-type cladding layer, and specifically, the cladding layers indicated by reference numeral 22 to 24 in FIG. 5. Also, the upper cladding layer of this embodiment is a p-type cladding layer, and specifically, the cladding layer indicated by reference numeral 29 in FIG. 5.

Figure 4:
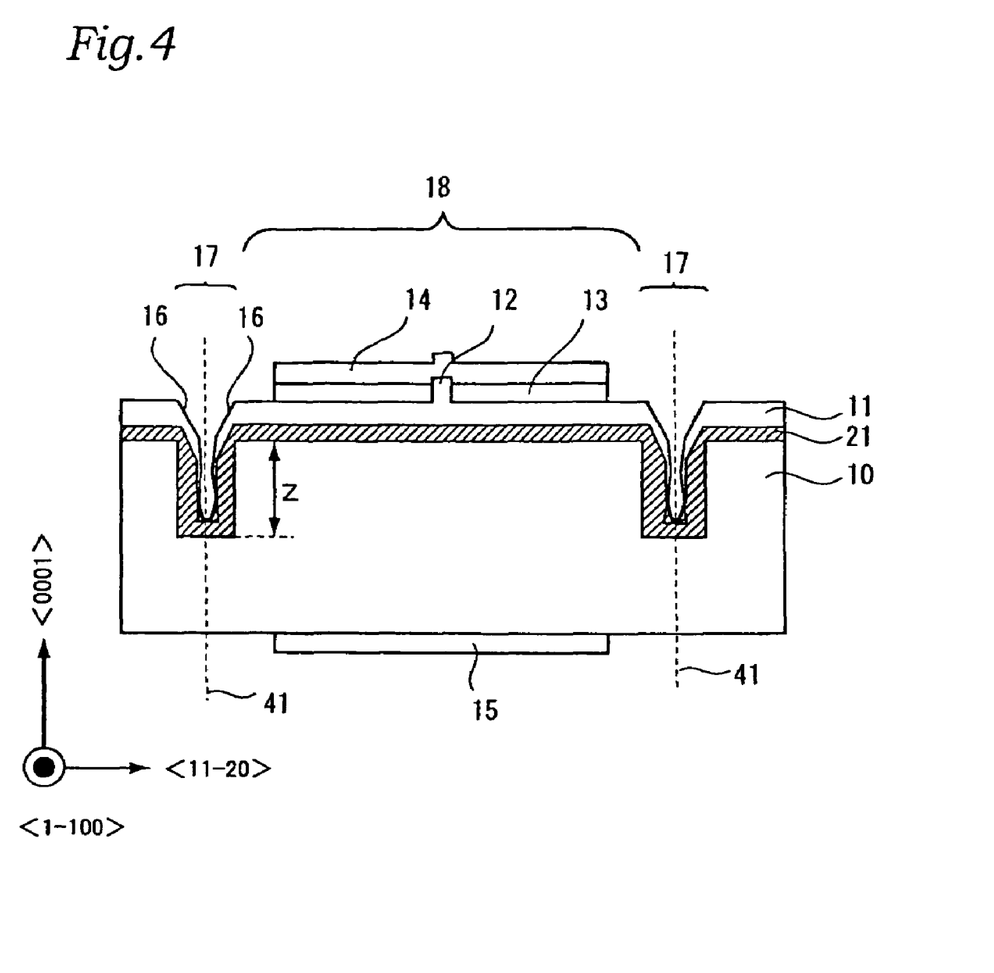
FIG. 4 is a schematic cross sectional view of a part of a bar provided with a nitride semiconductor laser device of an embodiment of the present invention.
Figure 5:
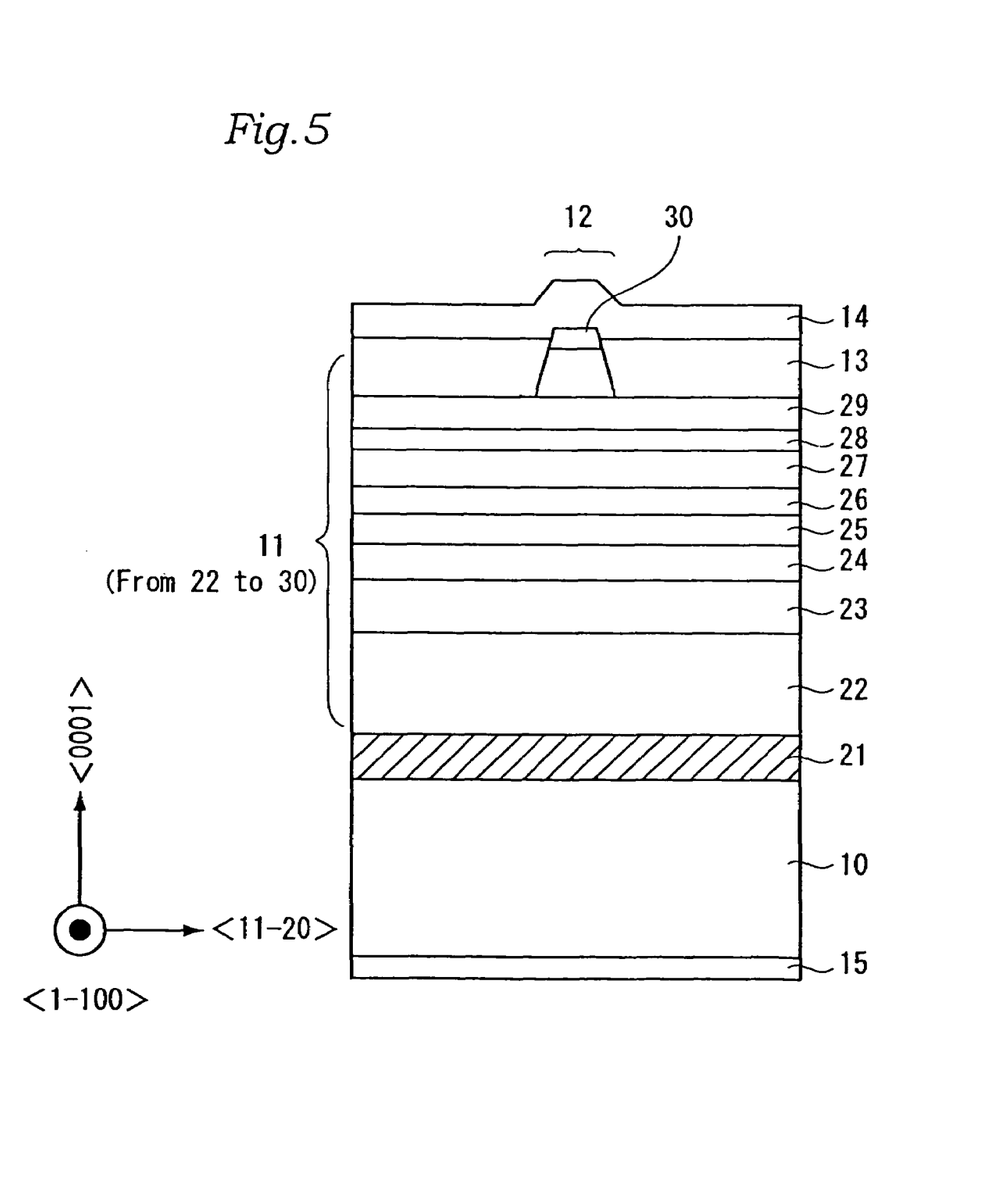
FIG. 5 is a schematic cross sectional view of the vicinity of the hill portion shown in FIG. 4.

Next, as shown in FIG. 4, on the surface of layer 11 of light-emitting-device structure made of nitride semiconductor, ridge stripe portion 12 as a current constricting portion and insulation film 13 (e.g., $SiO_2$) for the purpose of current constriction provided in a manner of sandwiching ridge stripe portion 12 are formed.

Ridge stripe portion 12 is generally formed by using the photolithography technique and the dry etching technique such that etching is carried out to leave a stripe shape from the outermost surface (p-type GaN contact layer 30) of layer 11 of light-emitting-device structure to the halfway of the thickness of p-type $Al_{0.1}Ga_{0.9}N$ cladding layer 29. The width of the stripe is from 1 to 3 μm, preferably from 1.3 to 2 μm. The distance from the interface between p-type GaN light guiding layer 28 and p-type $Al_{0.1}Ga_{0.9}N$ cladding layer 29 to the etching bottom surface is from 0.1 to 0.4 μm. Other than $SiO_2$, insulation film 13 can be an oxide or nitride of silicon, titanium, zirconium, tantalum, aluminum, or the like.

Next, on the exposed portion of striped-shaped p-type GaN contact layer 30, which is left unetched, and on insulation film 13, p-electrode 14 is formed in the order of Pd/Mo/Au. Other than this, p-electrode 14 can be Pd/Pt/Au, Pd/Au/, Ni/Au, or the like.

Next, by carrying out polishing or etching from the back surface of n-type GaN 10, the thickness of the wafer is reduced to 80-200 μm.

Then, as n-electrode 15, Hf/Al is formed on the back surface of n-type GaN 10 from the side near n-type GaN 10. The material used for n-type electrode 15 is not limited to Hf/Al, and Hf/Al/Mo/Au, Hf/Al/Pt/Au, Hf/Al/W/Au, Hf/Au, Hf/Mo/Au, or the like can be used. These materials can be such electrode materials that Hf is replaced with Ti or Zr.

As shown in FIG. 4, n-electrode 15 can be formed on each nitride semiconductor laser device, or n-electrode 15 can be formed on the entire back surface of n-type GaN substrate 10 (or on the back surface of the wafer).

After ridge stripe portion 12, p-electrode 14, and n-electrode 15 are thus formed, the wafer is cleaved in the direction perpendicular to the <1-100> direction (see FIG. 4), in which ridge stripe portion 12 is formed. Thus, an optical cavity is formed. In this embodiment, a waveguiding-type Fabry-Perot resonator with a cavity length of 600 μm was prepared. It should be noted that the length of the optical cavity is not limited to 600 μm, and the length can be within the range of from 300 μm to 1000 μm.

As described above, by carrying out the step of forming an optical cavity by cleaving the wafer, a bar shape is formed. The bar has a multiplicity of nitride semiconductor laser structures shown in FIG. 4 formed side by side. The formed cleaved facet(s) corresponds to the {1-100} surface of the nitride semiconductor crystal. Cleavage is carried out such that a ruled line is drawn on the entire back surface of the wafer with a diamond cutter and suitable force is applied on the wafer. It is possible that a line is drawn only on a part of the wafer, e.g., the edge portion of the wafer, with a diamond cutter, and this can act as the starting point of cleavage, or the optical cavity can be formed by etching.

The position in which the ridge stripe portion 12 is formed is not particularly specified insofar as the position is a flat region on hill portion 18, and more preferably, the position is 20 μm or more apart from the edge of the hill portion. In this embodiment, ridge stripe portion 12 was formed in the center of hill portion 18.

After two cleaved facet(s) are thus formed at the front and back of the waveguiding-type Fabry-Perot resonator, on both the cleaved facet(s), dielectric films made of $SiO_2$ and $TiO_2$ with 70% reflectivity are alternately deposited, thereby forming dielectric multi-layered reflective films. Of the two formed cleaved facet(s), one is made a laser outputting surface, and for example, the reflectivity of the dielectric multi-layered reflective film formed on the corresponding cleaved facet(s) is made 5%. The other cleaved facet(s) is made a laser reflecting surface, and for example, the reflectivity of the dielectric multi-layered reflective film formed on the corresponding cleaved facet(s) is made 95%. It should be noted that the reflectivity is not limited to these values. Also, the dielectric film material is not limited to $SiO_2/TiO_2$, and for example, $SiO_2/Al_2O_3$ or the like can be used.

Next, by dividing the bar in which a multiplicity of nitride semiconductor laser devices are formed side by side in the direction parallel to ridge stripe portion 12, separate nitride semiconductor laser devices (chips) are obtained. Here the obtained bar is placed on a stage with the back surface side of the wafer facing upwards, the positions to be flawed are aligned by using an optical microscope, and ruled lines are drawn on the back surface of the bar with a diamond cutter. Then, suitable force is applied on the bar to divide it along the ruled lines, thereby forming nitride semiconductor laser devices (chips). This method is called the scribing method.

Other than the scribing method, the chip dividing step can be carried out by, for example, the dicing method, in which flawing or cutting is carried out by using a wire saw or thin blade, the laser scribing method, in which heating is carried out by radiation of laser light from an excimer laser or the like and subsequently rapid cooling is carried out to form a crack at the radiation portion and the crack acts as a scribed line, the laser ablation method, in which laser light of high energy density is radiated and evaporated to carry out groove cutting treatment, or the like.

By the chip dividing step described above, the nitride semiconductor laser devices formed over hill portions 18 are divided into separate chips as shown in FIG. 4. The width of each divided nitride semiconductor laser device is 400 μm. In this embodiment, on n-type GaN substrate 10, groove portions 17 and hill portion 18 were formed every 400 μm, and cleavage was carried out at the vicinity of the center of groove portion 17 and along dividing line 41 shown in FIG. 4. It should be noted that while in this embodiment division was carried out at groove portion 17, division can exclude groove portion 17 and be carried out only at hill portion 18, resulting in a nitride semiconductor laser device that does not include groove portion 17. Although the position of dividing line 41 is not limited to those described above, the position is preferably at least 20 μm or more apart from ridge stripe portion 12.

The wafer of this embodiment prepared in the method described above was cleaved in the <11-20> direction, and the cross section of the wafer was observed with an SEM (Scanning Electron Microscope). Groove portion 17, formed on the substrate, was not filled up with underlying layer 21 or layer 11 of light-emitting-device structure but formed a concave. In this concave, crystal surfaces formed in the vicinities of the side surfaces of the groove portion existed, and each of the crystal surfaces was the {11-22} surface. As described above, when, after accumulating underlying layer 21 over n-type GaN substrate 10 on which groove portions 17 and hill portion 18 were formed and forming crystal surfaces 16, layer 11 of light-emitting-device structure made of nitride semiconductor was accumulated, the flatness of the surface in the vicinity of the center of the hill portion was satisfactory and the thickness of layer 11 of light-emitting-device structure made of nitride semiconductor was uniform.

When measuring for cracks in the wafer (nitride semiconductor laser device) was carried out, the number of cracks per area of 1 cm$^2$ was from 0 to 1 when the groove depth Z was from 0.5 μm to 8 μm. When the groove depth Z was less than 0.5 μm, there was such a tendency that the number of cracks increased as Z became less. This is because the grooves are filled up immediately in the course of growth and the crystal surface cannot be maintained. If the groove depth Z is greater than 8 μm, although the number of cracks remains from 0 to 1, surface flatness deteriorates. Incidentally, in a nitride semiconductor laser device of the prior art, 3 to 6 cracks occurred per area of 1 cm$^2$, and the flatness of the surface was not satisfactory and the thickness of layer 11 of light-emitting-device structure was not uniform. By using the present invention in such a manner, cracks were inhibited, and at the same time, the uniformity of surface flatness and thickness of layer 11 of light-emitting-device structure was realized, resulting in an improved yield rate.

While in this embodiment an n-type GaN underlying layer is used as the underlying layer 21, such an underlying layer of AlGaN can be used that the composition ratio of Al is as described in (1) above. As the n-type dopant, Si is preferably used, and the Si density is preferably from $5\times10^{17}$ cm$^3$ to $8\times10^{18}$ cm$^3$.

While active layer 26 of multi-quantum well structure of this embodiment has such a structure that starts with a barrier layer and ends with a barrier layer, such a structure can be used that starts with a well layer and ends with a well layer. The number of the well layers is not limited to three as described above and can be ten or less, because the threshold value current density is low and room-temperature continuous oscillation is realized. In particular, the number of the well layers is preferably from two to six because the threshold value current density is low. It is possible to add Al in active layer 26 of multi-quantum well structure.

While in this embodiment a Fabry-Perot resonator is provided, this system is not to be restrictive, and such a nitride semiconductor laser can be used that uses another feedback system such as a distributed feedback (DFB) laser in which the grating is provided inside the current injection region, and a distributed bragg reflector (DBR) laser in which the grating is provided outside the current injection region.

By using the present invention, a reduction in cracking, improvement of surface flatness, and uniformity of thickness of the nitride semiconductor light-emitting device are realized, thereby improving the yield rate of the nitride semiconductor light-emitting device. The nitride semiconductor light-emitting device according to the present invention refers to, for example, a nitride semiconductor laser diode, a nitride semiconductor light-emitting diode, and the like. Also, the present invention is suitable for blue semiconductor lasers mounted in the optical pickups of optical disk devices.

The embodiment herein described is to be considered in all respects as illustrative and not restrictive. The scope of the invention should be determined not by the Embodiments illustrated, but by the appended claims, and all changes which come within the meaning and range of equivalency of the appended claims are therefore intended to be embraced therein.

What is claimed is:

1. A nitride semiconductor light-emitting device comprising:
    a nitride semiconductor substrate wherein a groove is formed on the surface; and
    a nitride semiconductor layer provided so as to cover a side wall of the groove and having the crystal surface which is tilted at an angle of 53.5° to 63.40° with respect to a surface of the nitride semiconductor substrate.

2. The nitride semiconductor light-emitting device according to claim 1, wherein said groove is striped and is parallel to the <1-100> direction.

3. The nitride semiconductor light-emitting device comprising:
    a nitride semiconductor substrate wherein a groove is formed on the surface; and
    a nitride semiconductor layer provided so as to cover a side wall of the groove and having a {11-22} crystal face.

4. The nitride semiconductor light-emitting device according to claim 3, wherein the main surface of the nitride semiconductor substrate is the C surface {0001} and the slope of the main surface of the nitride semiconductor substrate is within 2°.

* * * * *